United States Patent [19]

Takemae et al.

[11] 4,409,678

[45] Oct. 11, 1983

[54] SEMICONDUCTOR MEMORY DEVICE

[75] Inventors: Yoshihiro Takemae; Fumio Baba, both of Yokohama, Japan

[73] Assignee: Fujitsu Limited, Kanagawa, Japan

[21] Appl. No.: 234,195

[22] Filed: Feb. 13, 1981

[30] Foreign Application Priority Data

Feb. 16, 1980 [JP] Japan ................................. 55-18358

[51] Int. Cl.³ ............................................. G11C 7/02
[52] U.S. Cl. ................................... 365/206; 365/226; 307/572
[58] Field of Search ................ 365/206, 226; 307/279, 307/572

[56] References Cited

U.S. PATENT DOCUMENTS

| 3,806,741 | 4/1974 | Smith | 307/304 |
|---|---|---|---|
| 3,978,459 | 8/1976 | Koo | 365/206 |
| 4,030,084 | 6/1977 | Fisher et al. | |
| 4,115,710 | 9/1978 | Lou | 307/304 |
| 4,308,468 | 12/1981 | Olson | 307/572 |
| 4,347,588 | 8/1982 | Hoffmann et al. | 365/206 |

FOREIGN PATENT DOCUMENTS

| 2235417 | 1/1975 | France . |
| 2420877 | 10/1979 | France . |
| 50-24054 | 3/1975 | Japan . |
| 53-82252 | 7/1978 | Japan . |
| 53-102682 | 9/1978 | Japan . |
| WO80/01021 | 5/1980 | PCT Int'l Appl. . |
| WO80/02773 | 12/1980 | PCT Int'l Appl. . |

OTHER PUBLICATIONS

Oliphant, "Designing Memory Systems with the Intel 2107A 4k RAM", Intel Memory Design Handbook, 1975, pp. 3-1, 3-15.
Grubb et al., "Drive System with Noise Cancellation", IBM Tech. Disc. Bul., vol. 7, No. 5, 10/64, pp. 359-360.
Graham et al., "*Battery Backup Circuits for Memories*", IEEE Int. Solid State Circuits Conf., 2/80, pp. 58-59.
Martino et al., "An On-Chip Back-Bias Generator for MOS Dynamic Memory", IEEE Jnal. of Solid-State Cir., vol. SC-15, No. 5, 10/80, pp. 820-826.
Lee et al., "*A 80ns 5V-Only Dynamic RAM*", IEEE Int. Solid-State Cir. Conf., 2/79, p. 142.
Morimoto et al., "*High Speed DSA 4 Kbit Static RAM*", Trans. of the IECE of Japan, vol. E63, No. 7, 7/80, pp. 520-525.

Primary Examiner—Stuart N. Hecker
Attorney, Agent, or Firm—Staas & Halsey

[57] ABSTRACT

Disclosed is a semiconductor memory device which comprises a sense amplifier formed on a semiconductor substrate, paired bit lines connected to the sense amplifier and memory cells connected to the bit lines wherein a predetermined bias voltage is applied to the semiconductor substrate and the reading operation is performed by amplifying by the sense amplifier a voltage difference caused between the paired bit lines due to access to the memory cells. This semiconductor memory device is characterized in that a voltage of a phase reverse to a noise transmitted to the bias voltage applied to the semiconductor substrate is applied to the semiconductor substrate through an electrostatic capacitance formed on the semiconductor substrate to cancel the noise. By virtue of this characteristic feature, influences of such noises can be eliminated in the semiconductor memory device of the present invention.

5 Claims, 9 Drawing Figures

SEMICONDUCTOR MEMORY DEVICE

BACKGROUND OF THE INVENTION

(1) Field of the Invention

The present invention relates to a semiconductor memory device including a noise canceller for a substrate bias voltage.

(2) Description of the Prior Art

According to the conventional technique, a bulk bias voltage is applied to a substrate from the outside in a semiconductor memory device, and since this voltage is stabilized by a capacitor or the like, any variation of the voltage is not caused by circuit operations in the memory device. Recently, a method in which a bulk bias voltage is generated on the substrate has been adopted in the art. In this method, since it is necessary to perform the operation with reduced power consumption, the current should inevitably be reduced and a high impedance cannot be avoided in a bulk bias voltage-generating circuit. Most of the circuit elements are connected to the substrate through capacitances such as PN junctions. Accordingly, when the memory circuit is actuated and voltages at respective parts are changed, noises are given to the substrate through such capacitances as PN junctions. Therefore, in the case where a bulk bias voltage is internally generated, this voltage is changed according to operations of the memory circuit. Furthermore, since a high impedance is maintained in the bulk bias voltage-generating circuit, variations of the bulk voltage by noises cannot be absorbed or compensated in the bulk bias voltage-generating circuit. For example, variations of 1 to 2 volts take place in a bulk bias voltage of 4 volts. Such variation of the bulk bias voltage often results in changes of the threshold voltage of a transistor or variations of voltages at respective parts through PN junctions or the like, and it often happens that the circuit operations become unstable and operation errors are caused.

SUMMARY OF THE INVENTION

It is an object of the present invention to provide a semiconductor memory device in which the above defects of the conventional technique are eliminated.

Another object of the present invention is to provide a semiconductor memory device in which the bulk bias voltage is not influenced by a noise received by the substrate.

Still another object of the present invention is to provide a semiconductor memory device in which operations of circuits are stabilized and the occurrence of operation errors is prevented.

In accordance with the present invention, these and other objects can be attained by a semiconductor memory device which comprises a sense amplifier formed on a semiconductor substrate, paired bit lines connected to the sense amplifier and memory cells connected to the bit lines. A predetermined bias voltage is applied to the semiconductor substrate and the reading operation is performed by amplifying through the sense amplifier a voltage difference caused between the paired bit lines due to access to the memory cells. The semiconductor memory device being characterized in that a voltage of a phase reverse to that of a noise transmitted to the bias voltage applied to the semiconductor substrate is applied to the semiconductor substrate through an electrostatic capacitance formed on the semiconductor substrate.

Further features and advantages of the present invention will be apparent from the ensuing description with reference to the accompanying drawings to which, however, the scope of the invention is in no way limited.

DESCRIPTION OF THE PREFERRED EMBODIMENTS

Figure 1A:
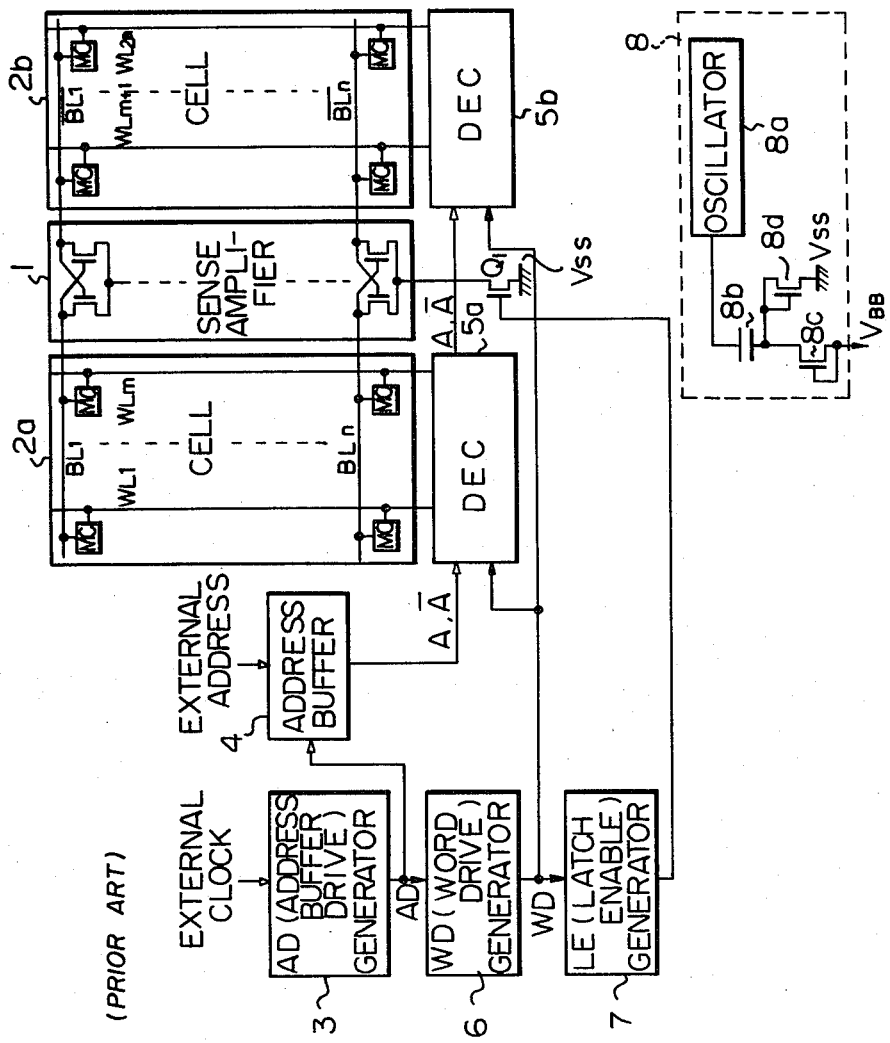
FIG. 1-A is a block diagram illustrating a conventional semiconductor memory device, and FIG. 1-B is a partial sectional view showing a substrate of the semiconductor memory device shown in FIG. 1-A.
Figure 1B:
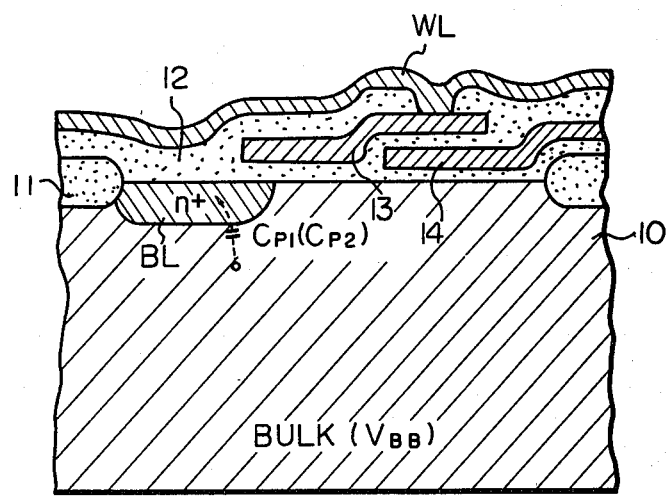

FIG. 1-A illustrates an embodiment of the conventional semiconductor memory device fabricated on a semiconductor substrate. This memory device comprises a sense amplifier 1, paired bit lines BL1 and $\overline{BL1}$, . . . BLn and $\overline{BLn}$, word lines WL1 to WLm and WLm+1 to WL2m, and cells 2a and 2b having memory cells MC, which are formed between the bit and word lines. An AD (address buffer drive) generator 3 receives an external clock signal and generates an AD signal which is supplied and applied to an address buffer 4. By the external address applied to the address buffer 4, A and $\overline{A}$ are decided and are then supplied to decoders 5a and 5b. Simultaneously, the output of the AD generator 3 is applied to a WD (word drive) generator 6 and the word drive generator 6 puts out a WD signal. This signal is applied to decoders 5a and 5b to select a word line. The WD signal is applied to an LE (latch enable) generator 7, and by an LE signal output by the latch enable generator 7, a transistor Q1 is turned on to actuate a flipflop of the sense amplifier 1 to read out information stored in the memory cell. Incidentally, this semiconductor memory device has a bulk bias generator 8, which comprises an oscillator 8a, a capacitor 8b and transistors 8c and 8d connected to generate a bulk bias voltage Vbb.

FIG. 1-B shows an interrelation between word lines WL and bit lines BL in the semiconductor substrate device shown in FIG. 1-A. Reference numeral 10 represents a substrate, reference numerals 11 and 12 represent insulating films, and reference numerals 13 and 14 represent polysilicon layers. The polysilicon layers 13 and 14 are constructed to create memory cells MC shown in FIG. 1-A. When the bulk bias voltage Vbb is generated on the substrate as in the semiconductor memory device shown in FIG. 1-A, the main element having influences on the bulk bias voltage Vbb is the bit line BL. As is well-known, the bit line is fabricated by forming, for example, a diffusion layer on the semiconductor substrate, and hence, a PN junction is formed. Accordingly, an electrostatic capacitance Cp1 (Cp2) is formed between the bit line and the substrate by a depletion layer of the PN junction. When the voltage of the bit line is changed, the bulk bias voltage Vbb is changed through this electrostatic capacitance according to this change of the voltage of the bit line. This state will not be described with reference to FIGS. 2-A and 2-B.

Figure 2A:
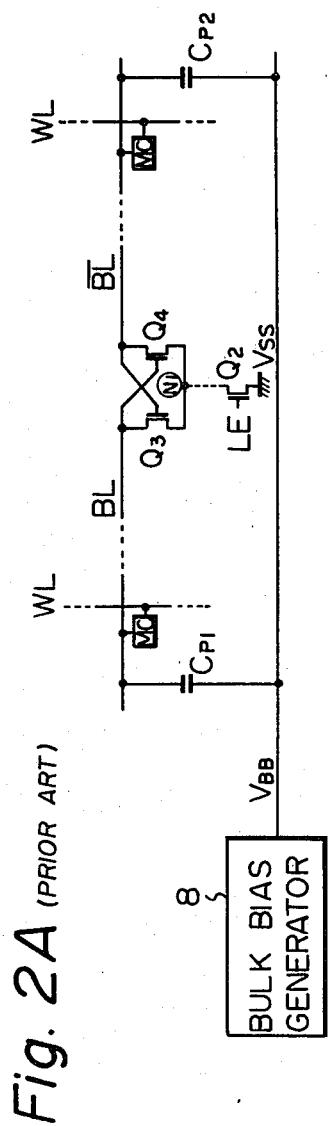
FIG. 2-A is a block diagram showing a bulk bias generator circuit in the semiconductor memory device shown in FIG. 1-A, and FIG. 2-B is a graph illustrating wave forms in the circuit shown in FIG. 2-A.
Figure 2B:
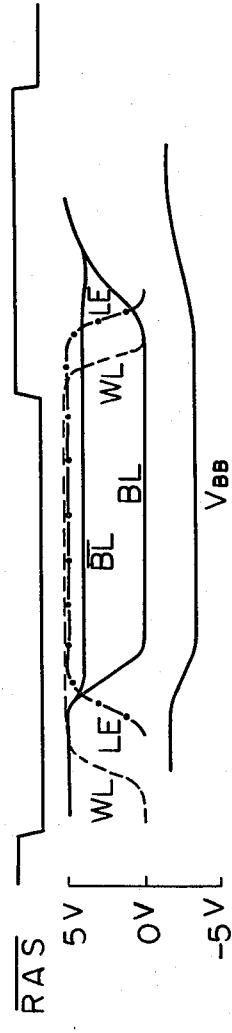

FIG. 2-A shows an interrelation between an electrostatic capacitance Cp1 present between one bit line and the bulk bias voltage generator 8 and an electrostatic capacitance Cp2 present between the bit line and the substrate in the semiconductor memory device shown in FIG. 1-A. FIG. 2-B illustrates the interrelationships among an external clock pulse RAS, a signal WL applied to the word line, a signal LE driving the flipflop of the sense amplifier, potentials of bit lines BL and BL driven to low and high levels by the flipflop of the sense amplifier and a bulk bias signal Vbb. In FIG. 2-B, it is shown that variations of 1 to 2 volts are caused in the bulk bias signal.

Figure 3:
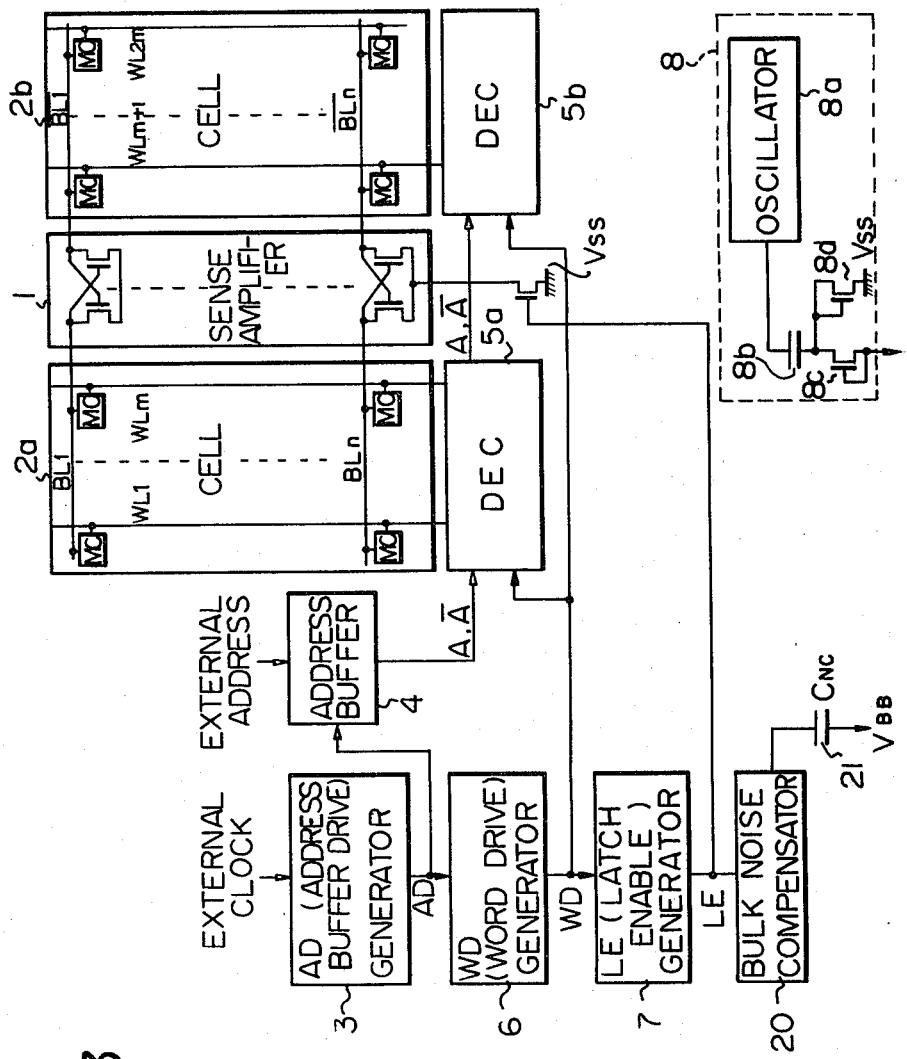
FIG. 3 is a block diagram illustrating one embodiment of the semiconductor memory device according to the present invention.

FIG. 3 illustrates one embodiment of the semiconductor memory device according to the present invention. As is shown in FIG. 3, in the present invention, a bulk noise compensator 20 is connected to the output of the latch enable generator 7 to generate on the output thereof a signal NC of a phase reverse to that of the noise to the bulk bias signal Vbb. If this signal NC is applied to the bulk bias signal Vbb through a capacitor 21, the noise is cancelled. The capacitor 21 is fabricated by an MOS diode comprising polysilicon, silicon oxide film and silicon substrate so that the capacitance of the capacitor 21 is substantially equal to the capacitance between the bit line and the substrate (p. 2).

Figure 4A:
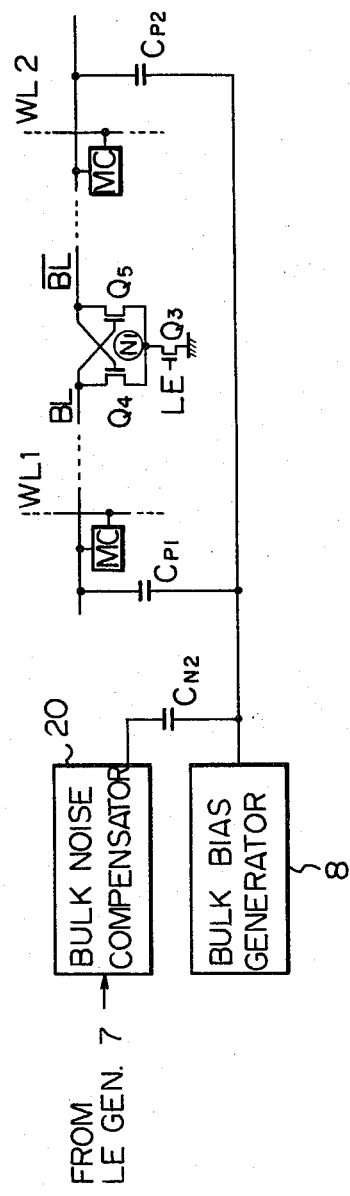
FIG. 4-A is a block diagram showing a bulk bias generator circuit and noise compensator circuit in the semiconductor memory device according to the present invention, and FIG. 4-B is a graph illustrating wave forms in the circuits shown in FIG. 4-A.
Figure 4B:
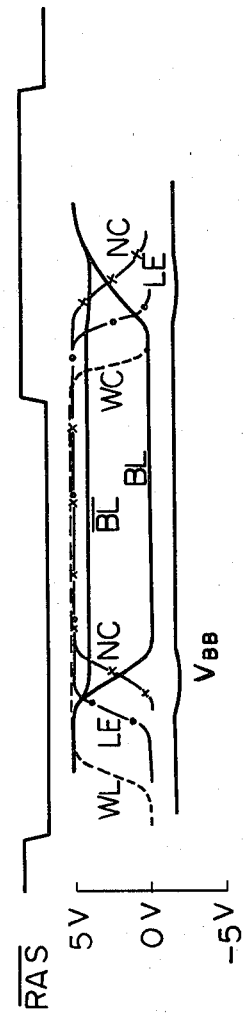

FIG. 4-A is a block diagram illustrating a circuit in which the substrate noise compensator 20 is formed in the circuit shown in FIG. 2-A and the signal of the noise compensator 20 is applied as a bulk bias compensating signal through the capacitor 21 (Cnc). FIG. 4-B illustrates the state where when the bulk bias compensating signal NC is applied, changes of the voltage of the bit line are cancelled by changes of the voltage of this compensating signal NC. Namely, FIG. 4-B shows that the bit line BL is maintained at a high level while the bit line BL is maintained at a low level. In FIG. 4-B, RAS represents a clock signal. When the voltage of the bit line BL is changed to a low level, a signal NC having a level Vnc of a phase reverse to that of the voltage level of the bit line is generated based on the clock signal RAS to cancel the noise, and the signal NC of the phase reverse to that of the noise is supplied to the substrate through the capacitor 21.

Since the influences of variations of the voltage level of the bit line BL on the bulk bias voltage are thus cancelled by the signal NC, the bulk bias signal Vbb becomes a smooth signal hardly influenced by variations of the voltage level of the bit line BL.

Figure 5:
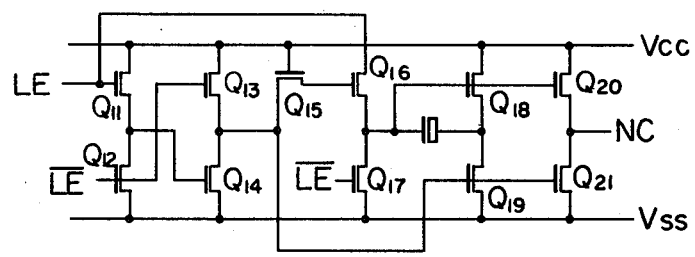
FIG. 5 is a block diagram illustrating one embodiment of the noise compensator circuit according to the present invention.

FIG. 5 illustrates one embodiment of the bulk noise compensator 20, which is constructed by transistors Q11 through Q22. In the embodiment shown in FIG. 5, transistors Q11 to Q14 form a delay circuit, transistors Q15 through Q19 form a bootstrap circuit, and transistors Q20 and Q21 form an output transistor circuit.

Figure 6:
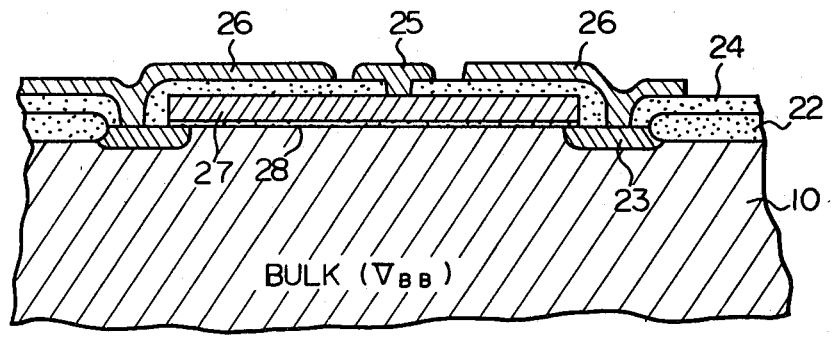
FIG. 6 is a sectional view showing one embodiment of the electrostatic capacitance connecting the noise compensator circuit to the substrate in the present invention.

FIG. 6 is a sectional view illustrating the state where a capacitor Cnc is formed between the bulk noise compensator 20 and the substrate. In FIG. 6, reference numerals 10, 22, 23, 24, 25, 26, 27 and 28 represent a substrate, an insulating film, an N+ layer, an insulating film, an aluminum layer, an aluminum layer, a polysilicon layer and a gate oxide film, respectively. The output of the bulk noise compensator 20 is connected to the aluminum layer 25, and the gate oxide film 28 located between the polysilicon layer 27 and the substrate 10 is given as the capacitance Cnc to the substrate 10. Incidentally, the output of the bulk bias generator 8 is applied to the aluminum layer 26.

Bit lines can also be formed by forming an oxide film on the silicon substrate and depositing aluminum or polysilicon on this oxide film. In this embodiment, an electrostatic capacitance is formed between such bit line and the substrate as in the foregoing embodiment, and noises are given to the bulk bias voltage by variations of the signal level of the bit line. However, these noises can similarly be cancelled by the arrangement illustrated in the above embodiment. Incidentally, a capacitor Cnc may also be formed by utilizing a PN junction. Noises are transmitted to the bulk bias voltage also from decoders and other circuits. In the present invention, influences of these noises to the bulk bias voltage can also be cancelled by the arrangement illustrated in the above embodiment.

As will readily be understood from the foregoing description, according to the present invention, there is provided a semiconductor memory device including a noise canceller for a bulk bias voltage, in which a stable bulk bias voltage can be obtained.

We claim:

1. A semiconductor memory device, operatively connected to receive a cancelling voltage, comprising:
   a semiconductor substrate having a predetermined bias voltage applied thereto;
   a sense amplifier;
   a pair of bit lines operatively connected to said sense amplifier;
   memory cells formed on said semiconductor substrate and operatively connected to said pair of bit lines; and
   a capacitance formed on said semiconductor substrate and operatively connected to receive said cancelling voltage, wherein the predetermined bias voltage is applied to the semiconductor substrate and a reading operation is performed by amplifying through said sense amplifier a voltage difference caused between said pair of bit lines due to access to one of said memory cells, and wherein said cancelling voltage of a phase reverse to that of a noise disturbing said predetermined bias voltage applied to said semiconductor substrate is applied to said semiconductor substrate through said capacitance.

2. A semiconductor memory device as set forth in claim 1, wherein said cancelling voltage of a phase reverse to that of the noise is a voltage cancelling a variation of the voltage of the semiconductor substrate due to the variation of the voltage of said pair of bit lines which is caused when said voltage difference is amplified by said sense amplifier during the reading operation.

3. A semiconductor memory device, operatively connectable to receive a word line signal, a bit line signal and a latch enable signal, comprising:
   a substrate;

a memory cell formed on said substrate;

a word line formed on said substrate, operatively connected to said memory cell and operatively connectable to receive the word line signal;

a bit line operatively connected to said memory cell and operatively connectable to receive the bit line signal;

a noise cancelling capacitor formed on said substrate;

a bulk bias generator, operatively connected to said substrate, for generating a bulk bias voltage signal; and a bulk noise compensator, operatively connected to said noise cancelling capacitor and operatively connectable to receive the latch enable signal, for generating a cancelling signal having a phase reversed with respect to the phase of the bit line signal, the cancelling signal cancelling out noise imparted to the bulk bias voltage signal.

4. A semiconductor memory device as recited in claim 3, wherein said bulk noise compensator comprises:

a delay circuit, operatively connectable to receive the latch enable signal, for generating a delay signal;

a bootstrap circuit, operatively connected to said delay circuit, for generating bootstrap signals; and an output transistor circuit, operatively connected to said bootstrap circuit and to said noise cancelling capacitor, for generating the cancelling signal.

5. A semiconductor memory device as set forth in claim 3, further comprising:

means, operatively connected to said word line, for generating the word line signal;

a latch enable circuit, operatively connected to said means for generating the word line signal and said bulk noise compensator, for generating the latch enable signal; and a sense amplifier, operatively connected to said latch enable circuit and to said bit line, for generating the bit line signal.

* * * * *

UNITED STATES PATENT AND TRADEMARK OFFICE
CERTIFICATE OF CORRECTION

PATENT NO. : 4,409,678
DATED : October 11, 1983
INVENTOR(S) : YOSHIHIRO TAKEMAE ET AL It is certified that error appears in the above-identified patent and that said Letters Patent is hereby corrected as shown below:

Front page, [73] Assignee, "Kanagawa" should be --Kawasaki--.

Column 3, line 12, "not" should be --now--;

line 22, "BL and BL" should be --BL and $\overline{BL}$--;

line 39, "(p. 2)" should be --Cp2--;

line 49, "BL" should be --$\overline{BL}$--.

Signed and Sealed this

Sixteenth Day of April 1985

[SEAL]

Attest:

DONALD J. QUIGG

Attesting Officer     Acting Commissioner of Patents and Trademarks